United States Patent
Ko et al.

(10) Patent No.: US 7,348,608 B2
(45) Date of Patent: *Mar. 25, 2008

(54) PLANAR AVALANCHE PHOTODIODE

(75) Inventors: Cheng C. Ko, Ann Arbor, MI (US);
Barry Levine, Livingston, NJ (US)

(73) Assignee: Picometrix, LLC, Ann Arbor, MI (US)

( * ) Notice: Subject to any disclaimer, the term of this patent is extended or adjusted under 35 U.S.C. 154(b) by 9 days.

This patent is subject to a terminal disclaimer.

(21) Appl. No.: 10/836,878

(22) Filed: Apr. 30, 2004

(65) Prior Publication Data

US 2004/0251483 A1   Dec. 16, 2004

Related U.S. Application Data

(63) Continuation-in-part of application No. PCT/US03/03323, filed on Feb. 3, 2003.

(60) Provisional application No. 60/353,530, filed on Feb. 1, 2002, provisional application No. 60/353,765, filed on Feb. 1, 2002.

(51) Int. Cl.
*H01L 29/732* (2006.01)
(52) U.S. Cl. ............ 257/185; 257/186; 257/191; 257/438; 257/E31.063; 257/E31.064
(58) Field of Classification Search .......... 257/183, 257/185, 186, 190, 191, 438, E31.063, E31.064
See application file for complete search history.

(56) References Cited

U.S. PATENT DOCUMENTS

| | | | |
|---|---|---|---|
| 4,236,069 A | 11/1980 | Laughlin | |
| 4,597,004 A | 6/1986 | Longeway et al. | |
| 4,686,550 A | 8/1987 | Capasso et al. | |
| 4,840,916 A * | 6/1989 | Yasuda et al. | 438/91 |
| 5,126,281 A | 6/1992 | Carey et al. | |
| 5,146,296 A | 9/1992 | Huth | |

(Continued)

FOREIGN PATENT DOCUMENTS

| | | | |
|---|---|---|---|
| JP | 09-199753 | * | 7/1997 |
| WO | WO 03/065416 | | 8/2003 |
| WO | WO 03/065417 | | 8/2003 |
| WO | WO 03/065418 | | 8/2003 |

OTHER PUBLICATIONS

Watanabe et al., IEEE Photonics Tehncology Letter 8, pp. 827-829, 1996.

(Continued)

*Primary Examiner*—Minh-Loan T Tran
(74) *Attorney, Agent, or Firm*—Brinks Hofer Gilson & Lione

(57) ABSTRACT

A planar avalanche photodiode includes a small localized contact layer on the top of the device produced by either a diffusion or etching process and a semiconductor layer defining a lower contact area. A semiconductor multiplication layer is positioned between the two contact areas and a semiconductor absorption layer is positioned between the multiplication layer and the upper contact layer. The photodiode has a low capacitance and a low field near the edges of the semiconductor multiplication and absorption layers.

41 Claims, 9 Drawing Sheets

U.S. PATENT DOCUMENTS

| | | | |
|---|---|---|---|
| 5,179,430 A | | 1/1993 | Torikai |
| 5,365,077 A | | 11/1994 | Metzger |
| 5,539,221 A | | 7/1996 | Tsuji et al. |
| 5,552,629 A | * | 9/1996 | Watanabe .................. 257/438 |
| 5,654,578 A | | 8/1997 | Watanabe |
| 5,818,096 A | | 10/1998 | Ishibashi et al. |
| 6,081,019 A | | 6/2000 | White |
| 6,104,047 A | * | 8/2000 | Watanabe .................. 257/186 |
| 6,107,652 A | | 8/2000 | Scavennec et al. |
| 6,229,161 B1 | | 5/2001 | Nemati et al. |
| 6,229,162 B1 | | 5/2001 | Watanabe |
| 6,326,650 B1 | | 12/2001 | Allam |
| 6,359,322 B1 | | 3/2002 | Haralson et al. |
| 6,548,878 B1 | | 4/2003 | Nauleau et al. |
| 6,635,908 B2 | * | 10/2003 | Tanaka et al. .............. 257/186 |
| 6,794,631 B2 | | 9/2004 | Clark |
| 2002/0070384 A1 | | 6/2002 | Clark et al. |
| 2003/0021322 A1 | | 1/2003 | Steinle et al. |

OTHER PUBLICATIONS

M.A. Itzler, C.S. Wang, S. McCoy, N. Codd and N. Komba, Planar bulk InP avalanche photodiode design for 2.5 and 10Gb/s applications, Proc 24th ECOC 1998, paper MoB03.

L.E. Tarof, J. Yu, R. Bruce, D.G. Knight, T. Baird and B. Oosterbrink, High frequency performance of seperate absorption grading charge and multiplication InP/InGaAs avalanche photodiodes, IEEE Photon. Technol. Lett. 5, 672-674, 1993.

Watanabe, T. Nakata, M. Tsuji, K. Makita, K. Taguchi, High reliability and low dark current 10 Gb/s planar superlattice avalanche photodiodes, IEEE Photon. Technol. Lett. 9, 1619-1621, 1997.

J.C. Campbell, S. Demiquel, F. Ma, A. Beck, X. Guo, S. Wang, X. Zeng, X. Li, J.D. Beck, M.A. Kinch, A. Huntington, L.A. Coldren, J. Decobert, N. Tscherptner, Recent advances in avalanche photodiodes, IEEE J. Select. Topics Quantum Electron., 10, 777-787, 2004.

R.R. Sutherland, C.P. Skrimshire, M.J. Robertson, A reliability methodology applied to very high reliability planar InGaAs/inP PIN photodetectors, Br. Telecom. Technol. J., 7, 69-77, Jan. 1989.

* cited by examiner

PLANAR AVALANCHE PHOTODIODE

RELATED APPLICATIONS

This application is a continuation-in-part of International PCT Application No. US03/03323, filed Feb. 3, 2003, which claims the benefit of U.S. Provisional Application Nos. 60/353,530 and 60/353,765, both of which were filed Feb. 1, 2002.

The entire contents of the above applications are incorporated herein by reference.

BACKGROUND

The present invention relates to photodetectors. More specifically, the present invention relates to avalanche photodiodes.

Owing to the known interaction between photons and electrons, advances have been made in the field of photodetectors in recent years, particularly in those photodetectors that utilize semiconductor materials. One type of semiconductor-based photodetector known as an avalanche photodiode includes a number of semiconductive materials that serve different purposes such as absorption and multiplication.

The avalanche photodiode structure provides a large gain through the action of excited charge carriers that produce large numbers of electron-hole pairs in the multiplication layer. In order to prevent tunneling in the absorption layer, the electric field is regulated within the avalanche photodiode itself, such that the electric field in the multiplication layer is significantly higher than that in the absorption layer.

A particular type of avalanche photodiode know as a mesa avalanche photodiode exposes high field p-n junctions and large numbers of exposed surface and interface states that make it difficult to passivate using a layer of insulating material. Therefore, conventional InP/InGaAs avalanche photodiodes use diffused structures which bury the p-n junction. However, these InP avalanche photodiodes require extremely accurate diffusion control of both the depth and the doping density of the p-type semiconductor regions as well as accurate control of the n-doped region into which this diffusion occurs. This critical doping control is essential, since the diffusion controls the placement of the p-n junction, the magnitude of the electric field in the multiplication region, the length of the avalanche region, as well as the total charge in the charge control layer which determines the values of the electric fields in both the high field InP avalanche region, which must be large enough to produce multiplication, as well as the low field InGaAs absorbing region, which must be small enough to avoid tunneling. In addition, accurately placed diffused or implanted guards rings are used in this type of arrangement, to avoid avalanche breakdown at the edges of the diffused p-n junction. This combination of guard rings and critically controlled diffusions increases the capacitance, lowers the bandwidth, and reduces the yield, thus increasing the cost of these APDs.

For ultrahigh speed performance detectors, InAlAs can be used as the avalanche layer rather than InP, since the higher bandgap reduces tunneling and thus allows thinner avalanche regions to be used leading to higher speeds and higher performance receivers. However, a diffused structure is even more difficult to achieve in InAlAs since the larger electron avalanche coefficient (relative to the holes) makes it desirable to multiply the electrons rather than the holes as in standard InP based APDS. Moreover, simply reversing the standard p-doped diffused structure is not sufficient, since n-dopants do not diffuse fast enough.

SUMMARY OF THE INVENTION

The present invention provides a planar avalanche photodiode including first and second contact layers, a semiconductor layer with a diffusion region, a semiconductor multiplication layer, and a semiconductor absorption layer. The diffusion region has a smaller area than the semiconductor layer and is positioned adjacent to the first contact layer, and the semiconductor multiplication layer is positioned between the first and second contact layers.

In another aspect of the invention, a planar avalanche photodiode includes first and second contact layers, a semiconductor absorption layer, and a semiconductor multiplication layer. The first contact layer has a smaller area than that of the semiconductor absorption layer. The semiconductor absorption layer is positioned between the first contact layer and the semiconductor multiplication layer, and the semiconductor absorption layer and the semiconductor multiplication layer are positioned between the first and second contact layers.

Various embodiments of the invention provide a photodiode with a low capacitance and a low field near the edges of the absorption and multiplication layers.

Other features and advantages will be apparent from the following description and from the claims.

DETAILED DESCRIPTION

Figure 1:
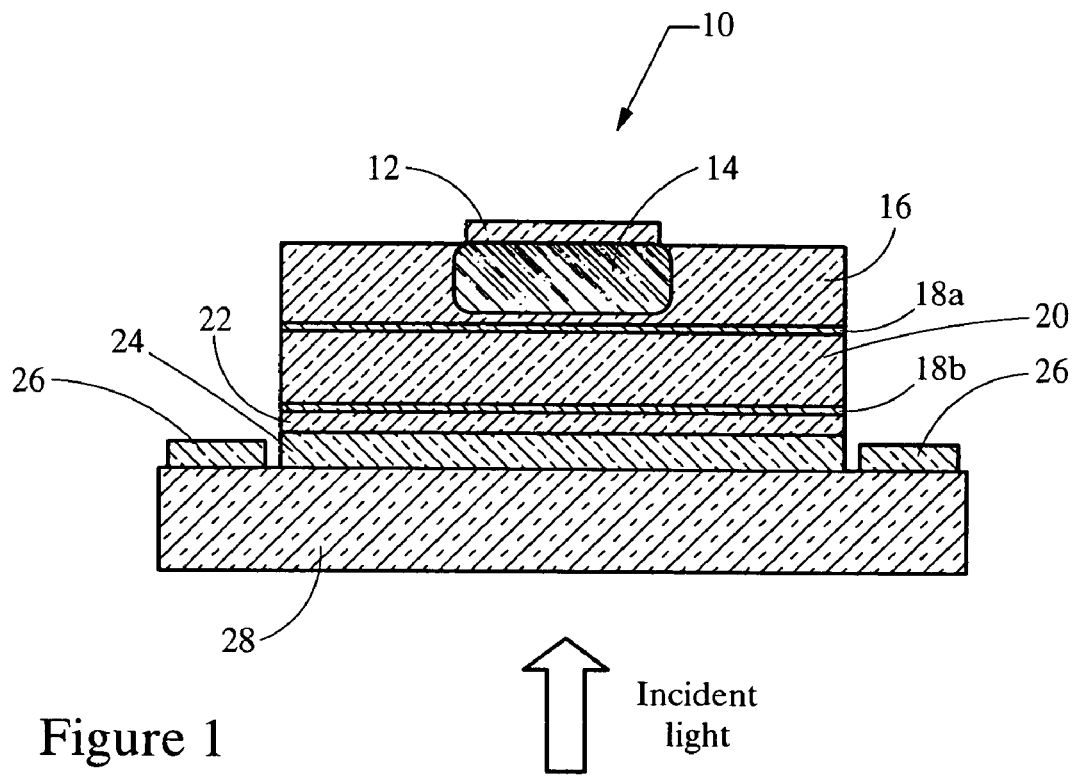
FIG. 1 is a cross-sectional view of a planar avalanche photodiode in accordance with the present invention.

Referring now to FIG. 1, a photodetector structure, in particular, a planar avalanche photodiode ("APD"), embodying the principles of the present invention is illustrated and designated at 10. As its primary components, the APD 10 includes a p-type contact layer 12 and a first n-type semiconductor layer 28 that defines a second n-type contact layer. The avalanche photodiode 10 is optimized for increased performance through diffused p-type doping creating a p-n junction and a p-contact. Specifically, the p-type contact layer 12 is positioned on a second n-type semiconductor layer 16, which includes a p-type diffusion region 14 to form a p-n junction and create a p-contact to the second n-type semiconductor layer 16. Alternatively, the semiconductor layer 16 can be a p type so that a p-p+ junction is formed by the diffusion. The semiconductor layer 16 can be undoped or low doped to facilitate forming a depletion region under a bias voltage.

The planar avalanche photodiode 10 further includes an undoped or n- or p-type semiconductor absorption layer 20. This absorption layer can be separated from the semiconductor layer 16 by a first grading layer 18 a to increase the speed of the photodiode. The absorption layer 20 is located between the semiconductor layer 16 and a semiconductor multiplication layer 24. In certain embodiments, the semiconductor absorption layer 20 is separated from the multiplication layer 24 by a p-type semiconductor charge control layer 22 and a second grading layer 18b. An n-type contact layer 26 collects electrons and is shown positioned on the first n-type semiconductor layer 28.

The first n-type semiconductor layer 28 is selected from a group including tertiary semiconductors, or group III-V semiconductors. Accordingly, the first n-type semiconductor layer 28 is either two elements from group III combined with one element from group V or the converse, two elements from group V combined with one element from group III. A table of representative groups of the periodic table is shown below.

| GROUP II | GROUP III | GROUP IV | GROUP V |
| --- | --- | --- | --- |
| Zinc (Zn) | Aluminum (Al) | Silicon (Si) | Phosphorus (P) |
| Cadmium (Cd) | Gallium (Ga) | Germanium (Ge) | Arsenic (As) |
| Mercury (Hg) | Indium (In) | | Antimony (Sb) |

In certain embodiments, the first n-type semiconductor layer 28 is InAlAs. However, it is understood that the first n-type semiconductor layer 28 may be any binary or tertiary semiconductor that provides the bandgap for optimized operation of the planar avalanche photodiode 10.

The semiconductor multiplication layer 24 is also selected from a group including tertiary semiconductors, or group III-V semiconductors. In the preferred embodiment, the semiconductor multiplication layer 24 is InAlAs. Preferably, the semiconductor absorption layer 20 is also selected from a group including tertiary semiconductors, or group III-V semiconductors. In the preferred embodiment, the semiconductor absorption layer 20 is InGaAs. However, it is understood that both the semiconductor absorption layer 20 and the semiconductor multiplication layer 24 may be any binary or tertiary semiconductor that provides the bandgap for optimized operation of the planar avalanche photodiode 10.

The second semiconductor layer 16 is also selected from a group including tertiary semiconductors, or group III-V semiconductors. As before, the second semiconductor layer 16 is either two elements from group III combined with one element from group V or the converse, two elements from group V combined with one element from group III. In the preferred embodiment, the second semiconductor layer 16 is InAlAs. However, it is understood that the second semiconductor layer 18 may be any binary or tertiary semiconductor that provides the bandgap for optimized operation of the planar avalanche photodiode 10.

As noted previously, the semiconductor layer 16 defines in part a p-type diffusion region 14 near the junction between the former and the p-type contact area 12. The small area of the localized p-type diffusion region 14 determines the capacitance of the planar avalanche photodiode 10 at the aforementioned diffusion junction, rather than that of the larger area outer mesa, thereby increasing the overall speed of the structure.

A feature of the planar avalanche photodiode 10 is that all the critical layer thicknesses and doping concentrations are regulated in the initial crystal growth, and thus are under control, such that they can be reproducibly grown and are uniform over the entire wafer. Accordingly, difficulties associated with process control during fabrication, particularly those related to the diffusion step, are not manifest.

Figure 2:
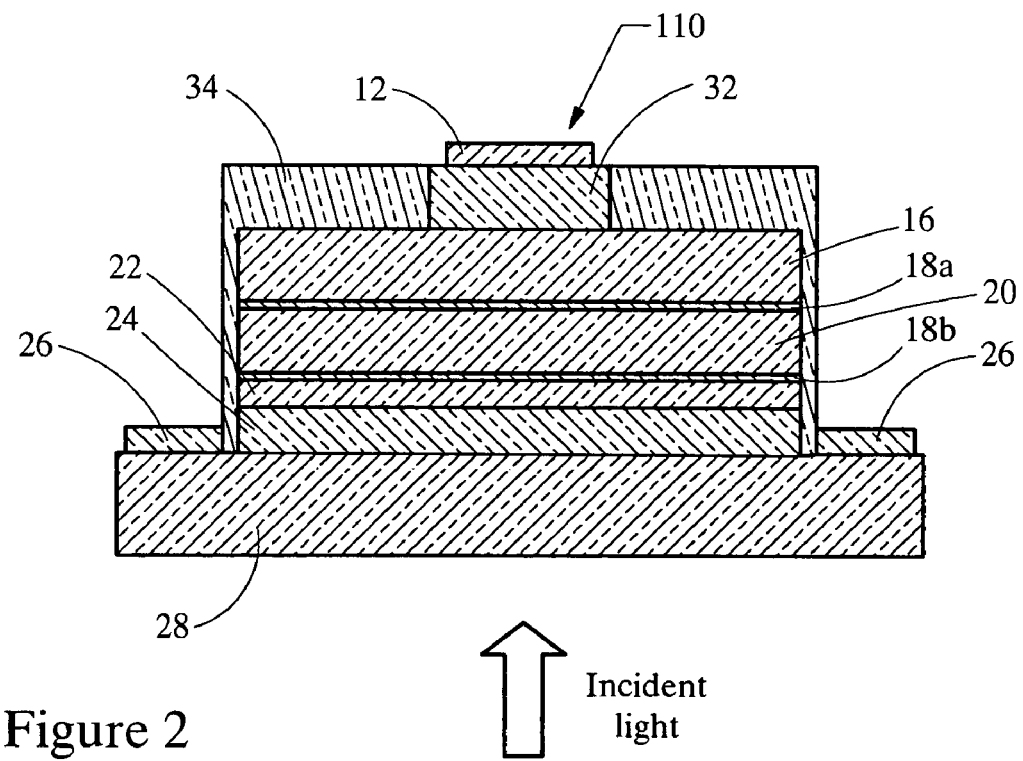
FIG. 2 is a cross-sectional view of an alternative planar avalanche photodiode in accordance with the present invention.

An alternative embodiment as shown in FIG. 2 as a planar avalanche photodiode 110 includes a mini-mesa structure 32. For the photodiode 110, the diffused semiconductor region 14 described above is replaced with a p-type semiconductor layer that is epitaxially grown into the mini-mesa structure 32. The p-type semiconductor layer 32 may be InAlAs, or any other type III-V semiconductor that provides a suitable bandgap for optimized performance.

Similar to the structure 10 shown in FIG. 1, the planar avalanche photodiode 110 also includes the p-type contact layer 12, a contact and passivation layer 16, made of, for example, InAlAs, and the first n-type semiconductor layer 28 providing another contact area. The p-type contact layer 12 is positioned on the p-type semiconductor layer 32. Passivated regions 34 are positioned surrounding the p-type semiconductor layer 32 and the remaining structure of the planar avalanche photodiode. Suitable passivation materials include BCB (benzocyclobutene), silicon dioxide, silicon nitride, or polyimide.

To fabricate the photodiode 110, the full structure is grown initially including the p-type semiconductor layer 32, and then it is etched down to the high bandgap passivation layer 16 using a stop etch layer, which is positioned above the passivation layer. The foregoing process defines a localized p− contact region 32, which controls the relevant capacitance area, thus resulting in a low capacitance and a high speed avalanche photodiode. Moreover, the entire planar avalanche photodiode 110 is epitaxially grown and does not require p-type diffusion.

Figure 12:
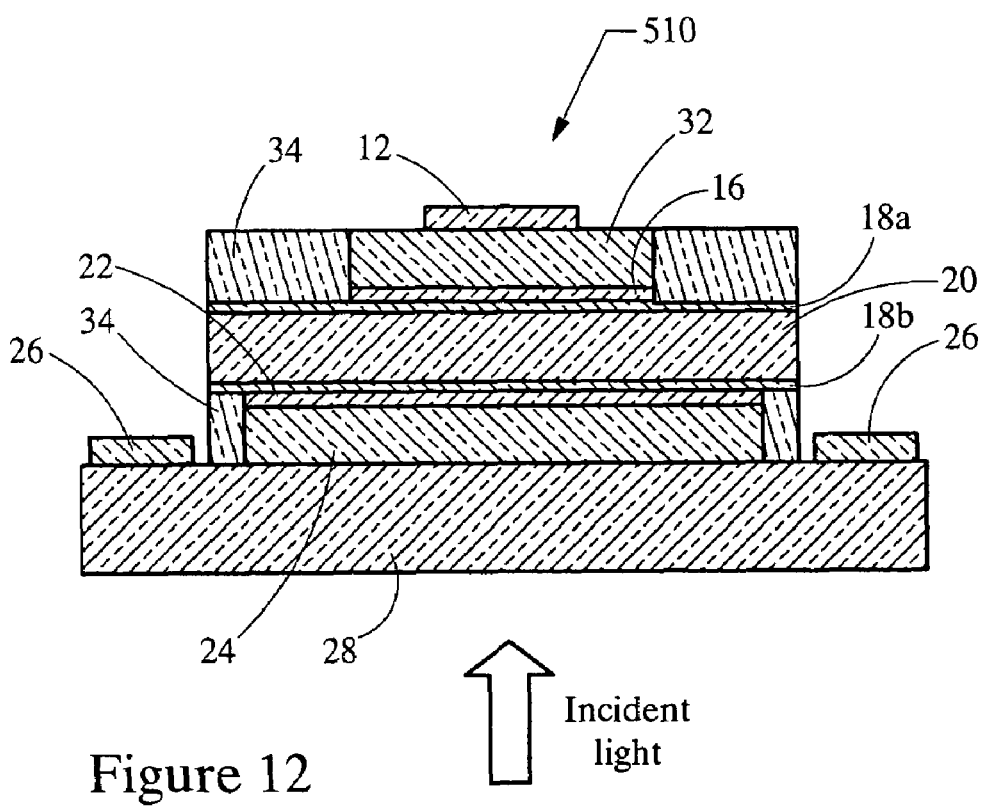
FIG. 12 is a cross-sectional view of a planar avalanche photodiode in accordance with yet another alternative embodiment of the present invention with additional oxidized field control structures.

Another approach to form the passivated region 34 is to utilize wet oxidation. The p-type semiconductor layer 32 can be oxidized through to the passivation layer 16 or the first grading layer 18a. Similarly, the sides of the outer mesa, which includes the n-type semiconductor multiplication layer 24, the p-type semiconductor charge control layer 22, and the second grading layer 18b, can be oxidized as indicated, for example, in FIG. 12 as a photodiode 510. Finally, it is possible to oxidize the first n-type semiconductor layer 28 so that there is a gradual interface between the unoxidized and oxidized layers. This reduces the field at the interface between the first n-type semiconductor layer 28 and the n-type semiconductor multiplication layer 24 leading to enhanced passivation.

The passivation approach may be combined with proton or oxygen implantation to additionally control the p-type semiconductor charge control layer 22 and reduce the field at the edge of the outer mesa to further improve passivation.

Additionally, the entire structure may be passivated by a suitable passivation technique such as BCB (benzocyclobutene). Alternatively, other surface passivation materials such as silicon dioxide, silicon nitride, or polyimide could be used to passivate the outside of the planar avalanche photodiode 210.

The planar avalanche photodiode 110, as well as photodiode 10, is high speed since the capacitance is low, due to the small area of the p-n junction, since the capacitance is not determined by the large noncritical isolation mesa. Note that these structures are reversed from the usual InP/InGaAs APD geometry since electrons are being avalanched in the InAlAs rather than holes as in InP. This reversal allows the depletion field region in the InGaAs absorption region to be at the top of the device (i.e. near the surface of the wafer) rather than the as in the conventional InP APD. That is, these structures 10, 110 allow the high field multiplication region to be buried under the low field absorption region. This feature means that the electric fields at the top surface look like those in a low field PIN detector, and thus guard rings are not needed, although, if desired, they can be used for additional field control.

FIGS. 1 and 2 show that the p+ charge control layer 22, which can be grown using carbon or Be as the p-dopant, extends across the entire isolation mesa. In spite of the large area of the p-n junction in this isolation mesa, the capacitance above punch-through is not substantially increased. This occurs because the device capacitance is (after charge punch-through and depletion) determined mainly by the area of the small diffused region (photodiode 10) or etched p+ region (photodiode 110) and not the isolation mesa, thus leading to a low capacitance, high speed APD.

Figure 3:
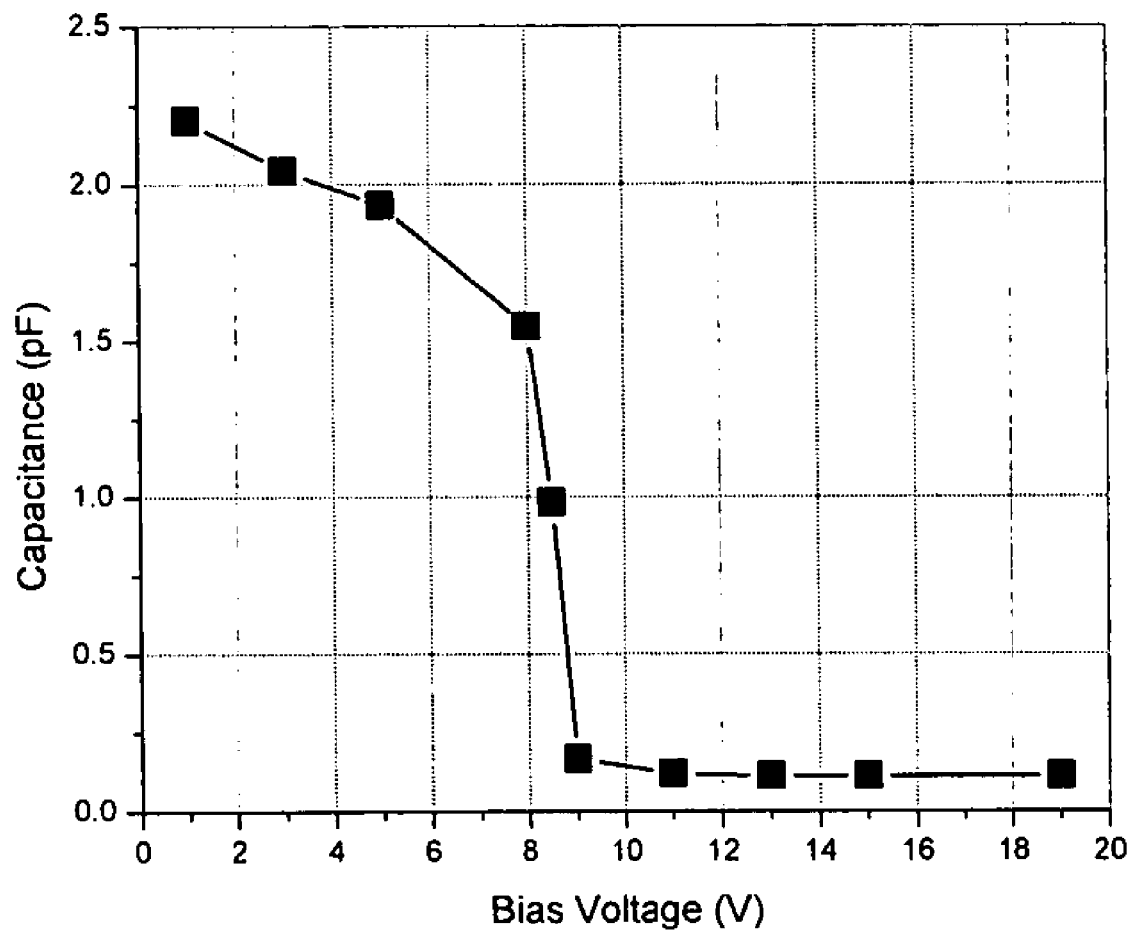
FIG. 3 is an experimental plot of the capacitance of the planar avalanche photodiode.
Figure 4:
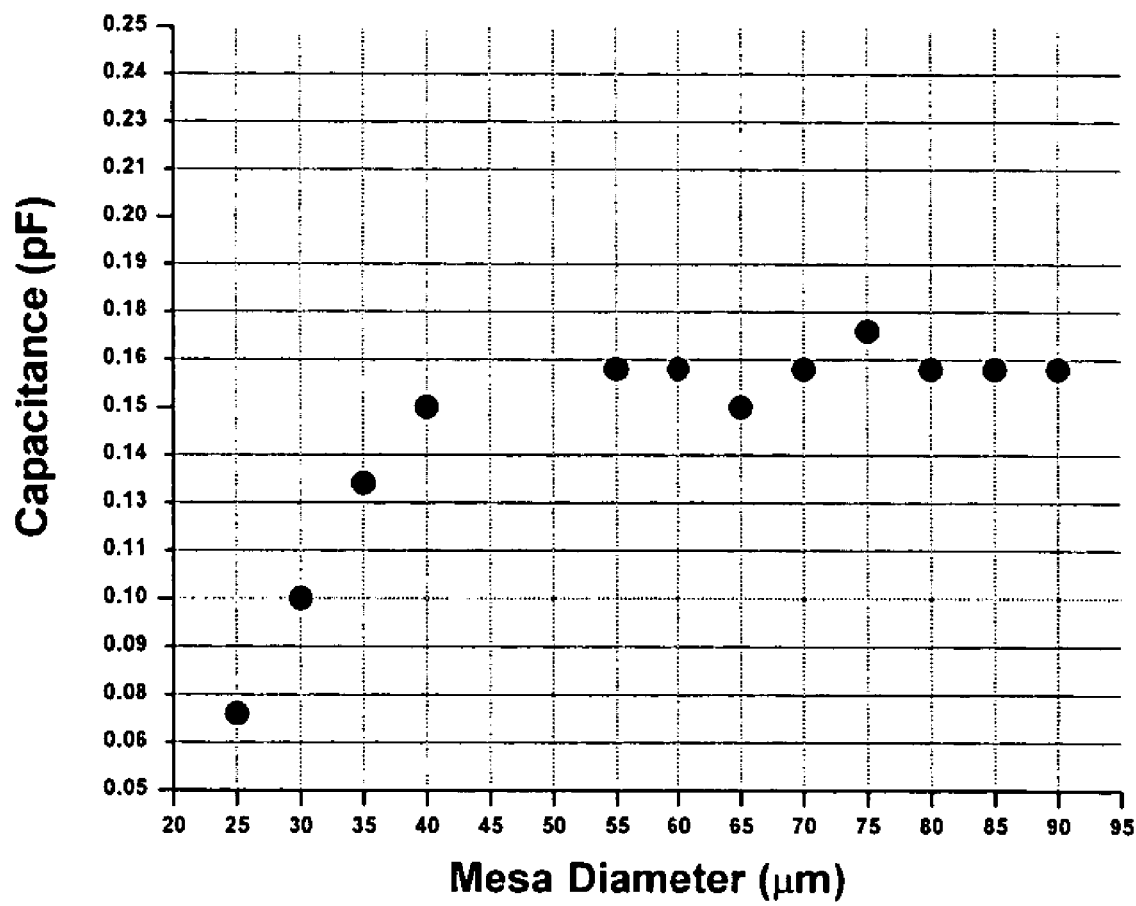
FIG. 4 is an experimental plot of the capacitance of the planar avalanche photodiode above punch-through as a function of the p-contact size and the isolation mesa size.

FIG. 3 shows the capacitance versus bias voltage for the structure shown in FIG. 2. The low capacitance occurring after the punch-through voltage is reached can be seen in FIG. 3. Specifically, the capacitance starts out at low bias with a value corresponding to the area of the large isolation mesa together with a thickness of the multiplication layer. However, at high bias after punch-through (that is, when the charge control and absorption layers are depleted), the capacitance drops to a value corresponding to the area of the small p-contact 12 together with a thickness corresponding to the total depletion region between the p- and n-contacts. In addition, FIG. 4 shows that the value of the capacitance above punch-through increases with the area of the p contact, but is independent of the area of the large isolation mesa as expected. For diameters less than 50 microns the mesa diameter along the abscissa corresponds to the mini-mesa (with the isolation mesa fixed at 50 microns), and for diameters greater than 50 microns the mini-mesa is fixed at 40 microns while the isolation mesa is increased.

Figure 5:
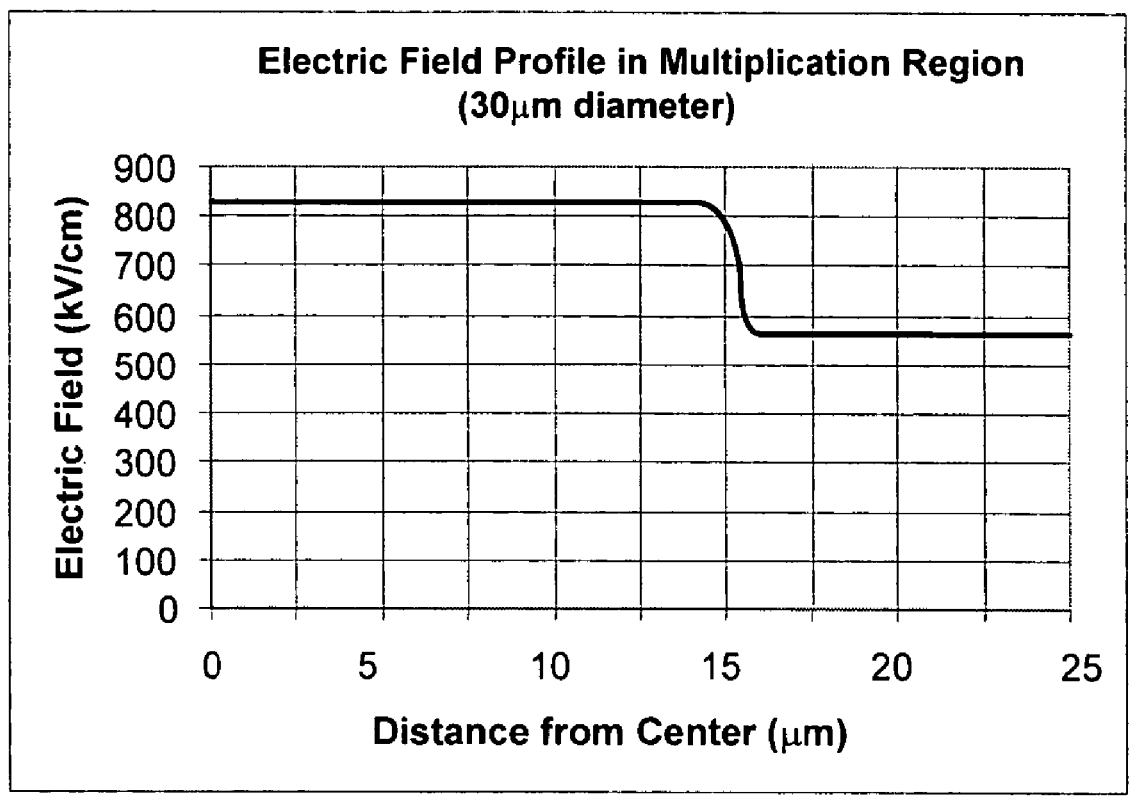
FIG. 5 is a schematic plot of the results of a calculation of the electric field profile through the multiplication layer showing that the field is a maximum in the center.
Figure 6:
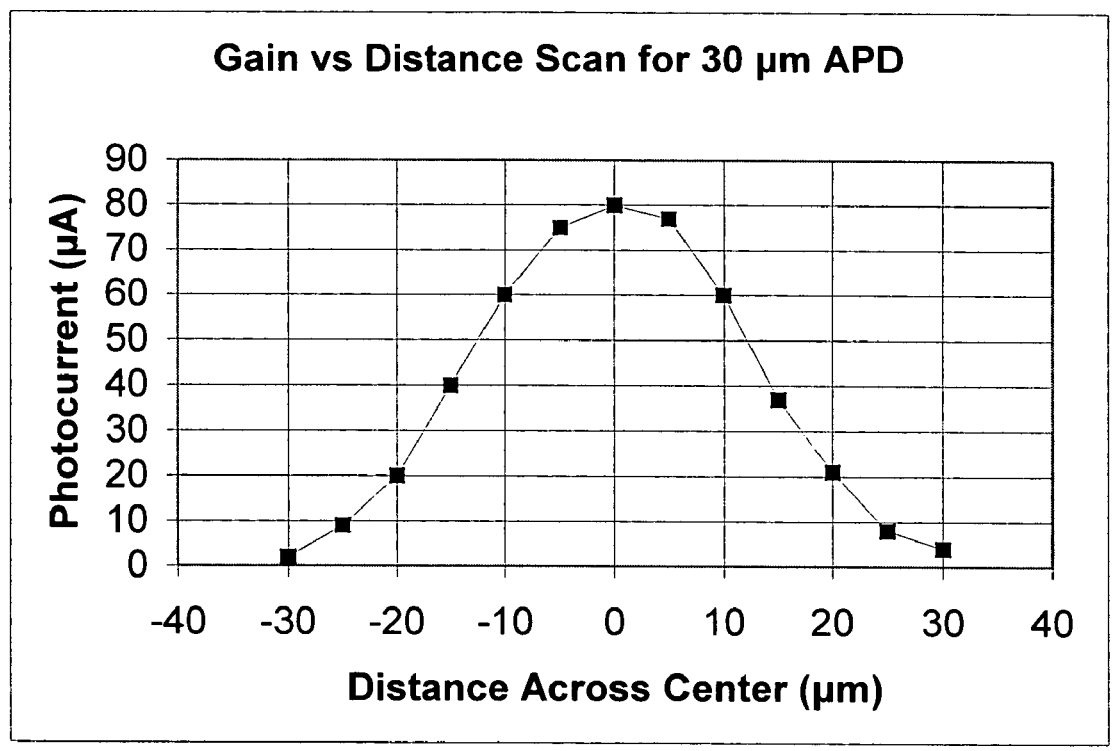
FIG. 6 is an experimental plot of the photocurrent gain as a function of distance across the device.

Furthermore, because of the electric field is a maximum in the center of the InAlAs avalanche region, and low at the edges of the avalanche region, guard rings are not necessary although they may be used for fine control of the fields. This is shown schematically in FIG. 5 where the calculated field in the avalanche region 24 is only large in the center of the APD directly under the p-contact. Thus, the avalanche gain, which depends exponentially on the field is only large in the center of the APD. This is experimentally confirmed as shown in FIG. 6, illustrating the measured photocurrent gain as a function of the distance from the center of the device.

Figure 7:
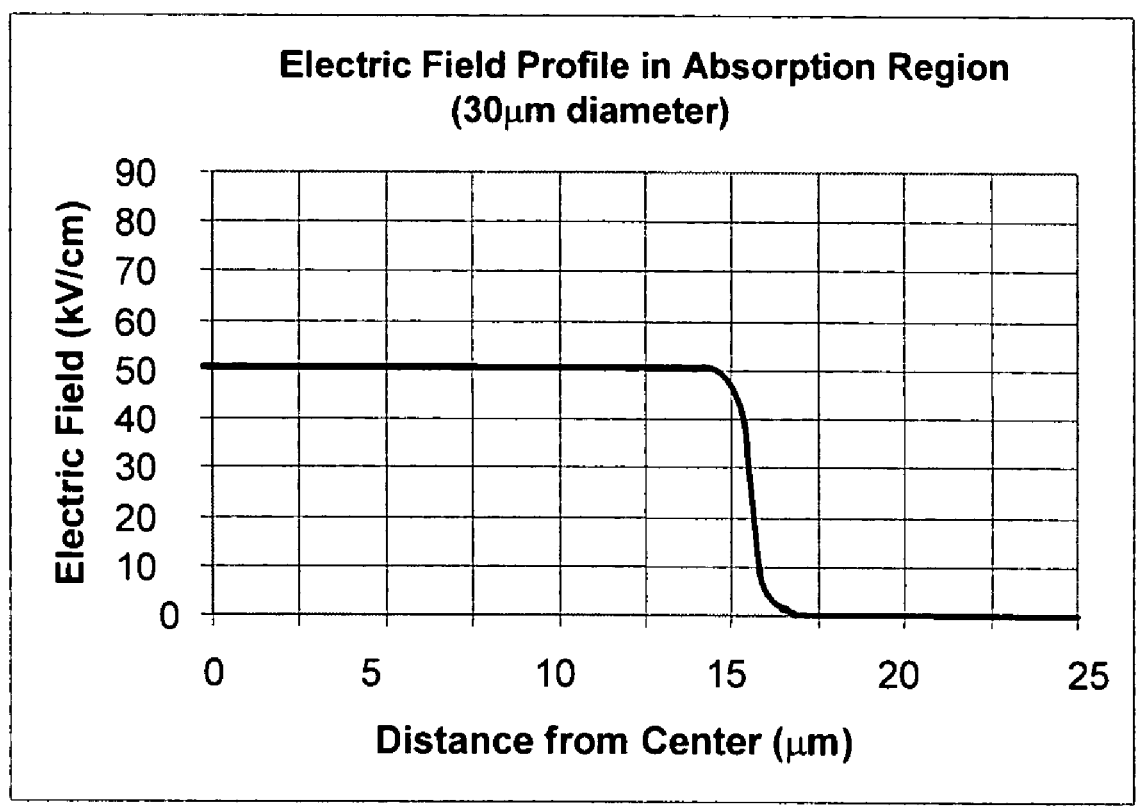
FIG. 7 is a schematic plot of the results of a calculation of the electric field profile through the absorption layer showing that the field is a maximum in the center and drops to a negligible value at the mesa edge.

Similarly, as shown in FIG. 7, the field in the low band-gap absorption layer 20 is negligible at the edge of the isolation mesa in sharp contrast to a conventional mesa APD where the field is large at the mesa edge. Furthermore, since the current is also reduced at these surfaces, any charging of surface or interface states at these boundaries is reduced. Thus, this device design effectively passivates this low band-gap layer. This field reduction and passivation results in a device with improved lifetime and aging characteristics. In some implementations, the lifetime can exceed 2000 hours at about, for example, 150° C. (that is, the device has a dark current that is substantially constant relative to an initial value over a time period greater than 2000 hours at about, for example, 150° C.), which corresponds to a lifetime that is greater than 20 years at normal operating temperatures, such as, for example, 70° C.

Figure 8:
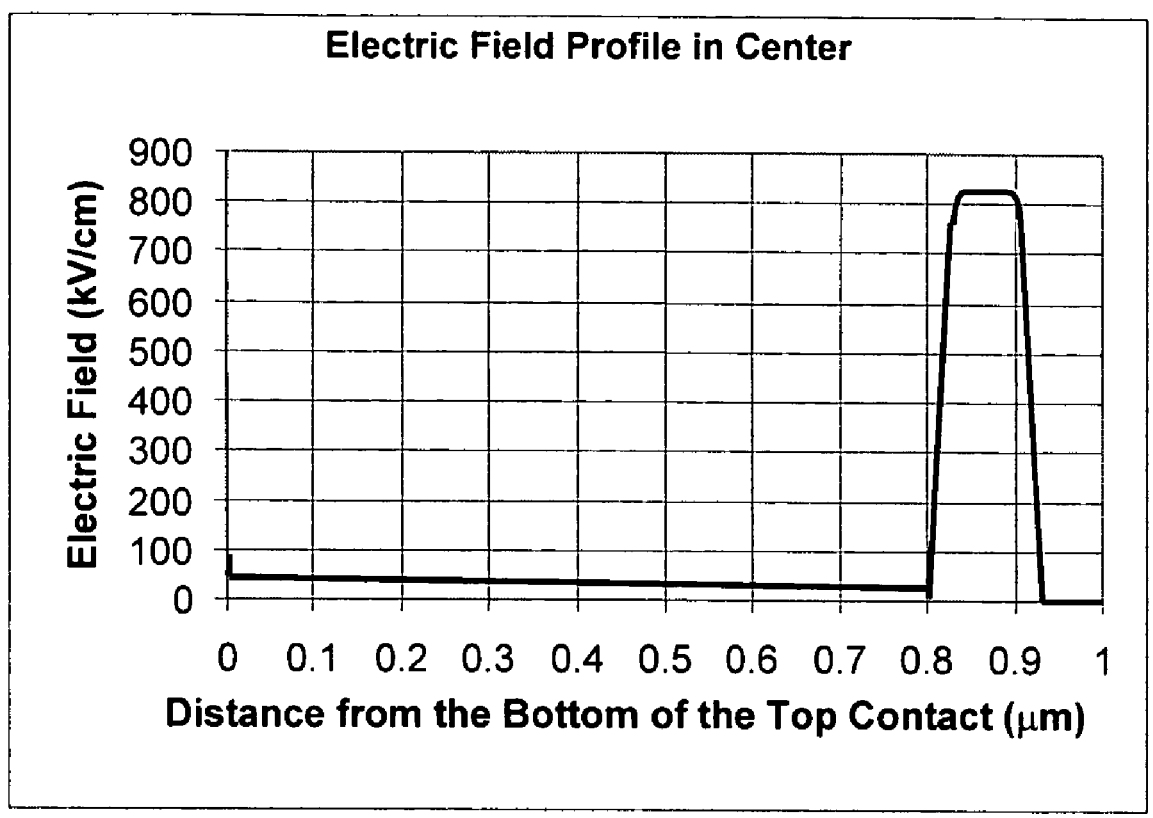
FIG. 8 is a schematic plot of the results of a calculation of the electric field profile through the center of the device, showing the field is high in the multiplication layer and low in the absorption layer.

Finally, FIG. 8 shows the field as a function of distance from the p-contact down to the n-contact in the center of the device. This plot shows that the charge control layer is effective in reducing the field in the absorption layer to a very low value, while simultaneously producing a high field in the avalanche layer for carrier multiplication.

Thus, to obtain the localized p-contact for the field localization, several approaches are possible, for example, using an etched mini-mesa p-contact (FIG. 2) or a diffused p-contact (FIG. 1). For the diffused p-contact, the InAlAs contact layer 16, into which the p-diffusion occurs, is grown low doped (either n- or p-) in order to reduce the electric field at the surface. The absorption and multiplication layers can be grown low doped to reduce the voltage required to deplete them.

Further note that although this contact is diffused it is different than the usual diffused p-contact for which critical doping control is essential, since for the standard diffused APD, this diffusion process controls the placement of the p-n junction, the magnitude of the electric field in the multiplication region, the length of the avalanche region, and the total charge in the charge control layer which determines the values of the electric fields in both the high field avalanche region, as well as the low field InGaAs absorbing region. In contrast, for the APD 10 this p-diffusion is only a p-contact requiring only noncritical process control.

As discussed previously, FIG. 2 illustrates achieving a localized p-contact region by etching a "mini-mesa" rather than using p-diffusing. That is, the full structure is grown initially including the p+ contact and then is etched down (stop etch layers can be used) to the low doped high bandgap InAlAs passivation layer. This defines a small localized p–contact region which controls the relevant capacitance area, thus resulting in a low capacitance, and a high speed APD. The advantage of this structure is that it is completely grown initially and does not require any p diffusion. This structure has a low capacitance (FIG. 3), a high speed response, a high gain-bandwidth, optical response localized in the center of the device (without the need of guard rings), and an extremely high sensitivity when used in a receiver.

In a particular implementation, a, set of parameters for such a mini-mesa APD is for example: a 50 Å p-doped cap layer of InGaAs followed by a 2000 Å p-doped layer of InAlAs and a 100 Å stop etch layer of InGaAs all doped $5 \times 10^{19}$ cm$^{-3}$. This is followed by a 500 Å passivation layer of undoped InAlAs, a 180 Å undoped digital grading layer, 8000 Å absorption layer of undoped InGaAs, another 180 Å undoped digital grading layer, a p-doped charge layer with a sheet charge of $4.5 \times 10^{12}$ cm$^{-2}$, a 1300 Å undoped InAlAs multiplication layer, and a 7000 Å n-doped $10^{19}$ cm$^{-3}$ contact layer. An advantageous mini-mesa diameter is 33 microns, and an advantageous outer contact mesa is 60 microns. The capacitance of such an APD is shown in FIG. 3. These parameter values are only one possibility, other doping and thickness values and other materials such as InP can be implemented in the APD. For instance, a contact layer can be an n-type contact layer using InP to minimize or eliminate the increase in resistance caused by the diffusion of, for example, Fluorine in InAlAs contact layers.

Since, as discussed above, the photodiodes 10, 110 substantially reduce the mesa electric field at the isolation mesa edge, compared with the standard APD, guard rings are not necessary. However, if desired, additional field control can be obtained by the use of guard rings or a double diffused shaped p-diffusion front at the p contact. This may also be accomplished, for example, by implanting an n-dopant (e.g. Si) or a deep donor (e.g. O) at the mesa edge, by implanting an ion to create a semi-insulating region (e.g. H, He) at the mesa edge, or by hydrogen passivation at the edge. All these methods reduce the magnitude of the p+ charge control layer at the mesa edge, and thus further reduce the electric fields. These modifications are shown schematically in FIGS. 9 and 10.

Figure 9:
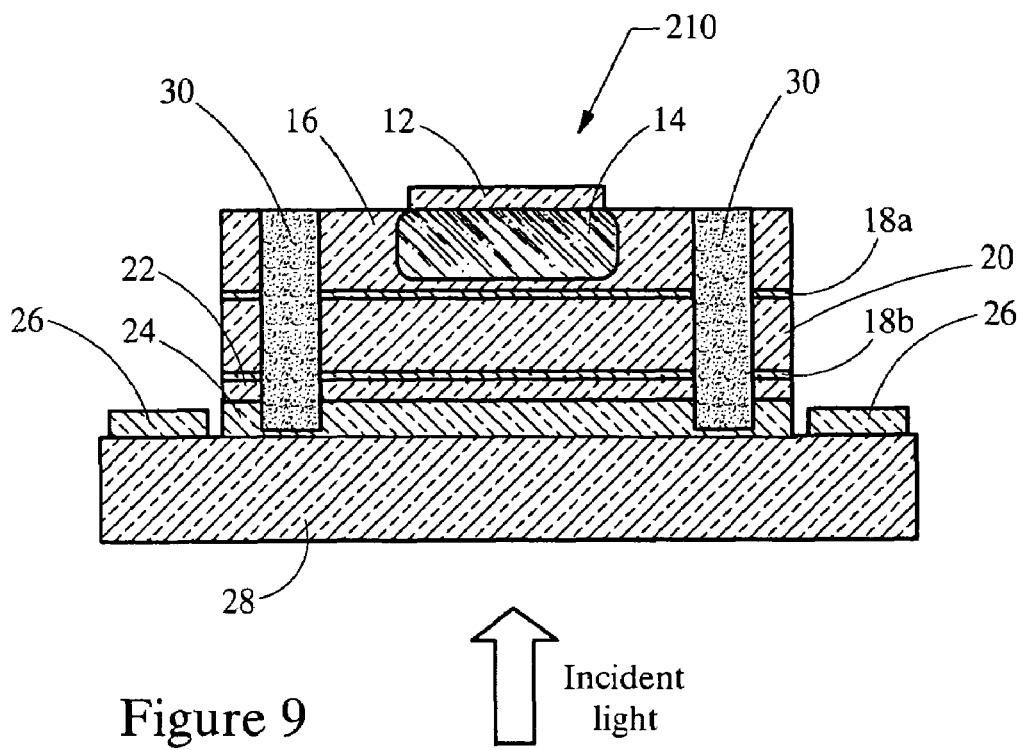
FIG. 9 is a cross-sectional view of the planar avalanche photodiode of FIG. 1 with additional field control structures in accordance with the present invention.
Figure 10:
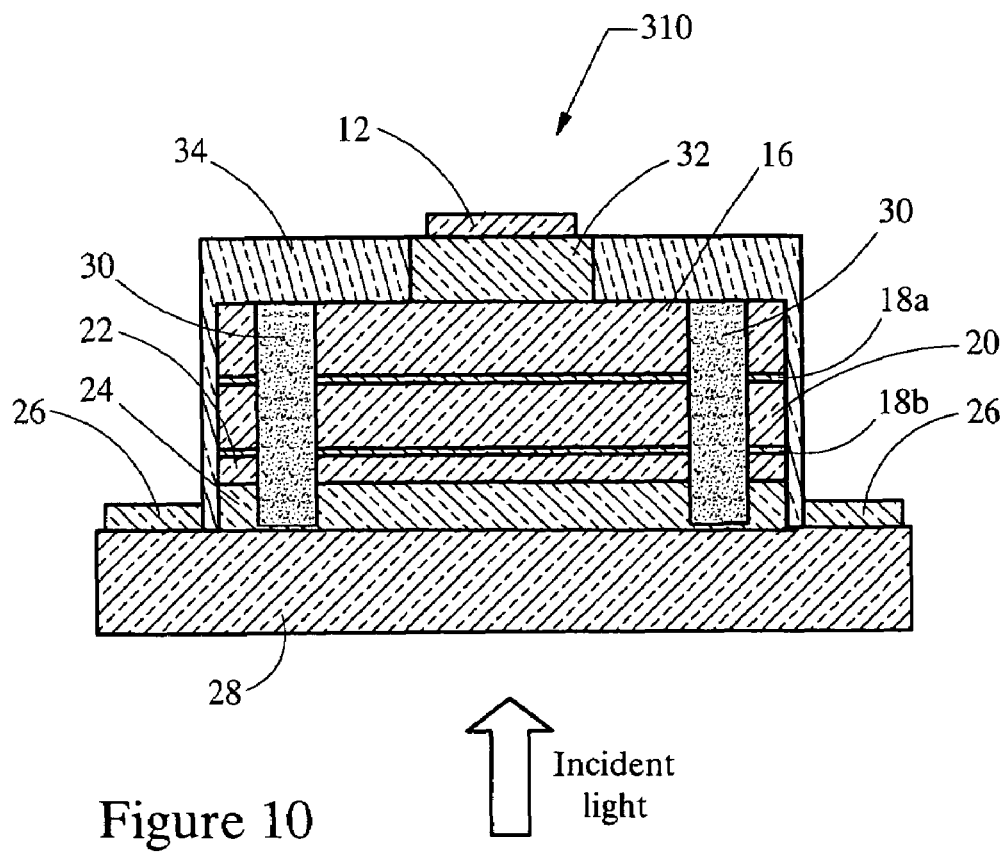
FIG. 10 is a cross-sectional view of the planar avalanche photodiode of FIG. 2 with additional field control structures in accordance with the present invention.

A planar avalanche photodiode designated as 210 in FIG. 9 includes a field control structure 30, such as an additional diffused region, an implanted region which can produce a doped or insulating region, or hydrogen passivation. The field control structure 30 is shown schematically as a pair of intrusions into the planar avalanche photodiode 110. FIG. 10 shows a planar avalanche photodiodoe 310 with the mini mesa structure 32 and the intrusions 30. The photodiode 310 may passivated by any of the other methods discussed above.

As described, various implementations of the present invention provide numerous advantages, for example, the structure of the planar avalanche region. Moreover, the structure of the planar avalanche photodiode 10 and 110 shown in FIGS. 1 and 2, respectively, or 210 and 310 shown in FIGS. 9 and 10, respectively, is reversed from a typical InP/InGaAs avalanche photodiode geometry since electrons are being avalanched in the n-type semiconductor multiplication layer 24 as opposed to the avalanching of holes in an InP multiplication region, as found in conventional avalanche photodiodes. This structural inversion allows the low field region in the InGaAs absorption region to be at the top of the device rather than the high field avalanche region as in a standard InP avalanche photodiode.

Thus, in the various implementations of the invention describe above, the high field avalanche region is at the bottom (i.e. buried below several semiconductor layers). Fabricating such a structure avoids the difficulty of precisely controlling the diffusion, etching or implantation steps, since all the layer thicknesses and dopings, including, in particular, the multiplication and the charge control layers, are produced by the initial crystal growth, Thus, all these parameters are under excellent control, can be reproducibly grown, and are uniform over the entire wafer. The high field critical part of the structure is truly planar, is buried and thus well passivated, and the diffusion or alternatively the mini-mesa etching step (which are used for producing a small area contact) do not require any difficult processing control.

Because of the high uniformity of these APDs, and further because of the simple processing required, all critical parameters grown in these devices are extremely uniform and have very high yield similar to PIN detectors. Thus, large uniform arrays of high performance APDs can be fabricated which are not readily achievable with standard APD technology.

Figure 11:
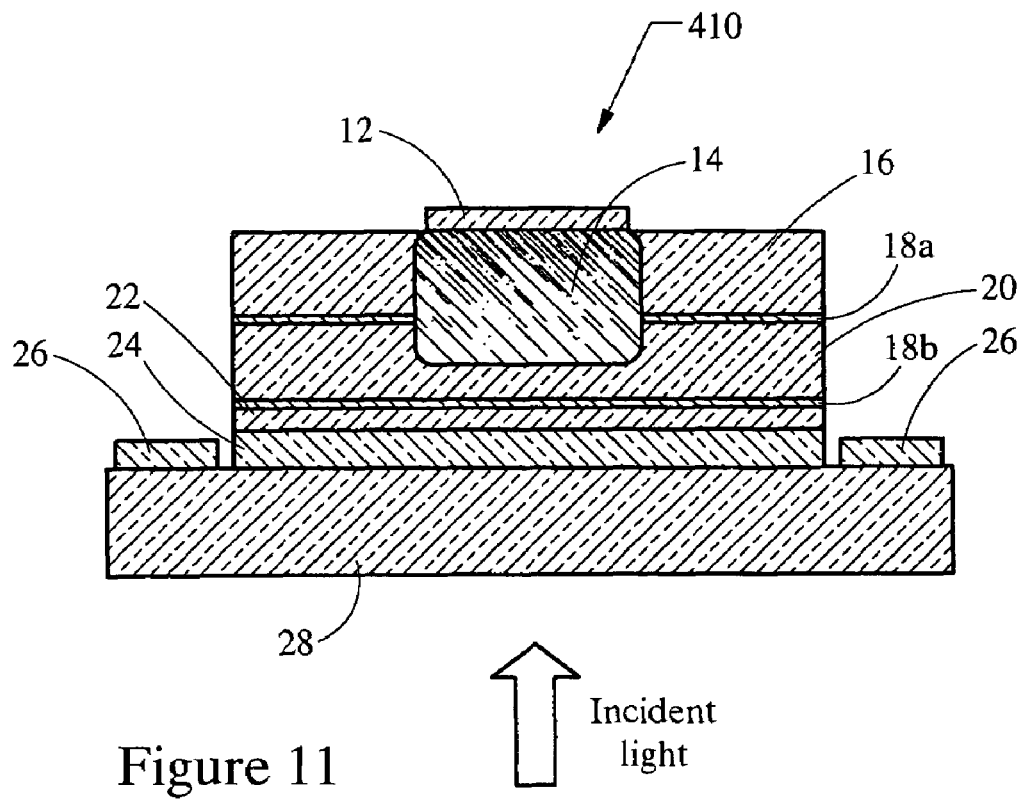
FIG. 11 is a cross-sectional view of a planar avalanche photodiode in accordance with another alternative embodiment of the present invention with the diffusion region extending into the absorption region.

The APD design in accordance with the invention can be combined with enhanced PIN detectors to make an APD 410 as shown in FIG. 11. By controlling the shape of the diffusion profile 14 as it progresses into the absorption region 20, a pseudo field can be created which speeds up the carrier transport similar to a high speed PIN detector. The p-diffused region 14 is most heavily doped near the top of the contact 12 and is progressively less doped as the diffusion proceeds into the absorption region. Accordingly, the p-doped hole concentration extends into the absorption layer and decreases as it progresses in the absorption layer, creating the pseudo filed and enhancing the electron transport, as well as decreasing the hole collection time. This permits a thicker absorption layer and thus improves sensitivity. Details of PIN detectors with the above described features can be found in U.S. Provisional Application No. 60/467,399, filed May 2, 2003, and International PCT Application entitled PIN Photodector, Attorney Docket No. 10555-068, filed herewith, the entire contents of which are incorporated herein by reference.

The photodetectors described above can be implemented as waveguide photodetectors or as single photon detectors. The photodetectors may have an integrated lens for improved light collection.

The forgoing and other implementations are within the scope of the following claims. For example, all n and p doped semiconductors may be interchanged. That is the n and p doping may be reversed to provide a top mini mesa of n type semiconductor and a lower contact of a p type.

What is claimed here is:

1. A planar avalanche photodiode comprising:
   a first semiconductor layer;
   a first contact layer, the first contact layer being on the first semiconductor layer;
   a second contact layer defining a small local contact;
   a second semiconductor layer with a diffusion region, the second semiconductor layer being undoped or low doped;
   the diffusion region having a smaller area than the second semiconductor layer and being positioned adjacent to the second contact layer, whereby the diffusion region creates a contact region between the diffusion region and the second semiconductor layer;
   a semiconductor multiplication layer positioned between the first and second semiconductor layers, whereby the semiconductor multiplication layer multiplies a generated carrier;
   a semiconductor absorption layer positioned between the semiconductor multiplication layer and the second semiconductor layer, the semiconductor absorption layer absorbs light, generating the carrier;
   a charge control layer, the charge control layer being located between the semiconductor absorbtion layer and the semiconductor multiplication layer, the charge control layer having a substantially uniform thickness and an area larger than the diffusion region; and
   at least one grading layer positioned adjacent to the semiconductor absorption layer.

2. The photodiode of claim 1 wherein the second semiconductor layer is an n-type and the diffusion region is a p-type.

3. The photodiode of claim 2 wherein the first semiconductor layer is an n-type, the second contact layer is a p contact and the first contact layer is an n contact.

4. The photodiode of claim 1 wherein the first semiconductor layer is a p-type, the second semiconductor layer is a p-type and the diffusion region is an n-type.

5. The photodiode of claim 4 wherein the second contact layer is an n contact and the first contact layer is a p contact.

6. The photodiode of claim 1 wherein both the second semiconductor layer and the diffusion region are p-types forming a p-p+ contact.

7. The photodiode of claim 1 wherein the second semiconductor layer is InAlAs.

8. The photodiode of claim 1 wherein the first semiconductor layer is InAlAs.

9. The photodiade of claim 1 wherein the semiconductor multiplication layer is InAlAs.

10. The photodiode of claim 1 wherein the semiconductor absorption layer is InGaAs.

11. The photodiode of claim 1 wherein the photodiode has a low capacitance and a low field near the sides of the absorption and multiplication layers.

12. The photodiode of claim 1 wherein the photodiode has a diffusion profile with a p-doped hole concentration extending into the semiconductor absorption layer in a decreasing manner to create a pseudo field, enhance electron transport, and decrease hole collection time.

13. The photodiode of claim 1 wherein the first semiconductor layer or the second semiconductor layer is an n-type of InP.

14. The photodiode of claim 1 wherein the photodiode has a dark current that is substantially constant relative to an initial value over a time period that exceeds 2000 hours at 150° C.

15. The photodiode of claim 1 wherein the photodiode has a lifetime that exceeds twenty years at 70° C.

16. The photodiode of claim 1 wherein the second semiconductor layer is InP.

17. The photodiode of claim 1 wherein the first semiconductor layer is InP.

18. The photodiode of claim 1 wherein the semiconductor multiplication layer is InP.

19. A planar avalanche photodiode comprising:
a first contact layer;
a first semiconductor layer, the first contact layer being on the first semiconductor layer;
a mini-mesa semiconductor layer;
a second contact layer, the second contact layer being on the mini mesa semiconductor layer;
a semiconductor absorption layer, the semiconductor absorption layer being positioned between the first semiconductor layer and the mini mesa semiconductor layer, the mini-mesa semiconductor layer having a substantially smaller area than the semiconductor absorption layer;
a semiconductor multiplication layer, the semiconductor multiplication layer being positioned between the first semiconductor layer and the semiconductor absorption layer; and
a charge control layer, the charge control layer being located between the semiconductor absorption layer and the semiconductor multiplication layer, the charge control layer being a single layer and having a substantially uniform thickness and an area larger than the mini-mesa semiconductor layer.

20. The photodiode of claim 19 futher comprising at least one grading layer positioned adjacent to the semiconductor absorption layer.

21. The photodiode of claim 19 wherein the first semiconductor layer is InAlAs.

22. The photodiode of claim 19 wherein the semiconductor multiplication layer is InAlAs.

23. The photodiode of claim 19 wherein the semiconductor absorption layer is InGaAs.

24. The photodiode of claim 19 wherein the mini-mesa semiconductor layer is an InAlAs semiconductor layer.

25. The photodiode of claim 19 wherein the first contact layer is a n contact.

26. The photodiode of claim 25 wherein the second contact layer is an p contact.

27. The photodiode of claim 19 wherein the first contact layer is an p contact.

28. The photodiode of claim 27 wherein the second contact layer is a n contact.

29. The photodiode of the claim 19 further comprising a low doped passivation region positioned between the mini-mesa semiconductor layer and the semiconductor absorption layer.

30. The photodiode of claim 29, wherein the low doped passivation region is InAlAs or InP.

31. The photodiode of claim 19 wherein the photodiode has a low capacitance and a low field near the edges of the absorption and multiplication layers.

32. The photodiode of claim 19 wherein the photodiode has a diffusion profile with a p-doped hole concentration extending into the semiconductor absorption layer in a decreasing manner to create a pseudo field, enhance electron transport, and decrease hole collection time.

33. The photodiode of claim 19 wherein the first semiconductor layer is an n-type of InP.

34. The photodiode of claim 19 wherein the photodiode has a dark current that is substantially constant relative to an initial value over a time period that exceeds 2000 hours at 150° C.

35. The photodiode of claim 19 wherein the photodiode has a lifetime that exceeds twenty years at 70° C.

36. The photodiode of claim 19, wherein the semiconductor absorption layer, the semiconductor multiplication layer and the semiconductor charge control layer each have a substantially similar diameter.

37. The photodiode of claim 19 wherein the first semiconductor layer is InP.

38. The photodiode of claim 19 wherein the semiconductor multiplication layer is InP.

39. The photodiode of claim 19 wherein the mini-mesa semiconductor layer is an InP semiconductor layer.

40. A planar avalanche photodiode comprising:
a first semiconductor layer;
a first contact layer, the first contact layer being on the first semiconductor layer contact;
a second contact layer;
a second semiconductor layer with an diffusion region, the diffusion region having a smaller area than the second semiconductor layer and being positioned adjacent to the second contact layer, whereby the diffusion region creates a junction between the diffusion region and the second semiconductor layer;
a semiconductor multiplication layer positioned between the first and second semiconductor layers, whereby the semiconductor multiplication layer multiplies a generated carrier;
a semiconductor absorption layer positioned between the semiconductor multiplication layer and the second semiconductor layer, whereby the semiconductor absorption layer absorbs light, generating the carrier; and the photodiode has a diffusion profile with a p-doped hole concentration extending into the semiconductor absorption layer in a decreasing manner to create a pseudo field, enhance electron transport, and decrease hole collection time.

41. A planar avalanche photodiode comprising:

a first contact layer:

a first semiconductor layer, the first contact layer being on the first semiconductor layer;

a mini-mesa semiconductor layer;

a second contact layer, the second contact layer being on the mini mesa semiconductor layer;

a semiconductor absorption layer, the semiconductor absorption layer being positioned between the first semiconductor layer and the mini mesa semiconductor layer, the mini-mesa semiconductor layer having a substantially smaller area than the semiconductor absorption layer;

a semiconductor multiplication layer, the semiconductor multiplication layer being positioned between the first semiconductor layer and the semiconductor absorption layer; and the photodiode has a diffusion profile with a p-doped hole concentration extending into the semiconductor absorption layer in a decreasing manner to create a pseudo field, enhance electron transport, and decrease hole collection time.

* * * * *